(12) United States Patent
Nishizawa et al.

(10) Patent No.: US 9,047,941 B2
(45) Date of Patent: Jun. 2, 2015

(54) ORGANIC MOLECULAR MEMORY

(75) Inventors: Hideyuki Nishizawa, Tokyo (JP); Reiko Yoshimura, Kanagawa (JP); Tsukasa Tada, Tokyo (JP); Shigeki Hattori, Kanagawa (JP); Masaya Terai, Tokyo (JP); Satoshi Mikoshiba, Kanagawa (JP); Koji Asakawa, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 133 days.

(21) Appl. No.: 13/425,796

(22) Filed: Mar. 21, 2012

(65) Prior Publication Data

US 2012/0241713 A1 Sep. 27, 2012

(30) Foreign Application Priority Data

Mar. 24, 2011 (JP) ................................. 2011-065295

(51) Int. Cl.
*H01L 51/10* (2006.01)
*H01L 29/792* (2006.01)
*G11C 13/00* (2006.01)
*B82Y 10/00* (2011.01)
*H01L 51/00* (2006.01)
*H01L 51/05* (2006.01)

(52) U.S. Cl.
CPC ......... *G11C 13/0016* (2013.01); *H01L 51/0098* (2013.01); *H01L 51/0078* (2013.01); *H01L 51/0092* (2013.01); *H01L 51/0595* (2013.01); *G11C 2213/53* (2013.01); *B82Y 10/00* (2013.01)

(58) Field of Classification Search
USPC .......................................................... 257/4
See application file for complete search history.

(56) References Cited

U.S. PATENT DOCUMENTS

2011/0040069 A1* 2/2011 Miura et al. .................. 528/380
2012/0241713 A1* 9/2012 Nishizawa et al. ............... 257/4

FOREIGN PATENT DOCUMENTS

JP 2007-538409 A 12/2007
WO WO 2005/117023 A2 12/2005

OTHER PUBLICATIONS

Office Action issued Jun. 25, 2013 in Japanese Patent Application No. 2011-065295 with English language translation.
M. A. Reed, et al., "Molecular random access memory cell", Applied Physics Letters, vol. 78, No. 23, 2001, pp. 3735-3737.
Qiliang Li, et al., "Capacitance and conductance characterization of ferrocene-containing self-assembled monolayers on silicon surfaces for memory applications", Applied Physics Letters, vol. 81, No. 8, 2002, pp. 1494-1496.
Chao Li, et al., "Fabrication approach for molecular memory arrays", Applied Physics Letters, vol. 82, No. 4, 2003, pp. 645-647.
U.S. Appl. No. 13/930,183, filed Jun. 28, 2013, Terai, et al.
U.S. Appl. No. 13/934,784, filed Jul. 3, 2013, Hattori, et al.
U.S. Appl. No. 14/196,265, filed Mar. 4, 2014, Nishizawa, et al.

* cited by examiner

*Primary Examiner* — Robert Carpenter
(74) *Attorney, Agent, or Firm* — Oblon, McClelland, Maier & Neustadt, L.L.P.

(57) ABSTRACT

An organic molecular memory of an embodiment includes a first conductive layer, a second conductive layer, and an organic molecular layer interposed between the first conductive layer and the second conductive layer, the organic molecular layer including charge-storage molecular chains or variable-resistance molecular chains, the charge-storage molecular chains or the variable-resistance molecular chains including fused polycyclic groups.

10 Claims, 19 Drawing Sheets

ORGANIC MOLECULAR MEMORY

CROSS-REFERENCE TO RELATED APPLICATION

This application is based upon and claims the benefit of priority from Japanese Patent Application No. 2011-065295, filed on Mar. 24, 2011, the entire contents of which are incorporated herein by reference.

FIELD

Embodiments described herein relate generally to organic molecular memories.

BACKGROUND

When organic molecules are used in memory cells, the memory cells can be made smaller in size, because organic molecules themselves are small in size. As a result, storage density of memory using molecules can be increased. The operation of memory cell can be achieving the change between the low resistance state and the high resistance state, and the change is corresponding to the change of electric current. For this purpose, molecules having a function to change its resistance depending on the applied electric field or injected charges are introduced between upper and lower electrodes. To change the state, the voltage is applied between the upper and lower electrodes. The difference of state can be detected by the electric current. Such attempts have been made to form memory cells. Another operation of memory cell can be achieving the change of the stored charges in molecule between the channel (electrode) and the gate electrode of FET, and the change is corresponding to the change of drain current. For this purpose, molecules having a function to storing injected charges are formed on an electrode, and the charges injected from the electrode are stored in the molecule. To change the stored charges, the voltage is applied between the upper and lower electrodes. The charge-stored state can be detected by the drain current. Such attempts have also been made to form memory cells.

In a small memory cell, however, the distances between the charges in the molecules and the surrounding electrodes are short. Therefore, charges are easily cleared from molecules due to movement of charges between the molecules and the electrodes. As a result, the charge retention time (the life or data retention time) of the organic molecular memory becomes shorter.

DETAILED DESCRIPTION

An organic molecular memory of an embodiment includes a first conductive layer, a second conductive layer, and an organic molecular layer interposed between the first conductive layer and the second conductive layer, the organic molecular layer including charge-storage molecular chains or variable-resistance molecular chains, the charge-storage molecular chains or the variable-resistance molecular chains including fused polycyclic groups.

The following is a description of embodiments, with reference to the accompanying drawings.

It should be noted that, in this embodiment, "charge-storage molecular chain" means a molecular chain that has a function to store charges therein, and can switch between a state to store the charges and a state not to store the charges through application and removal of external voltage.

It should also be noted that, in this specification, "variable-resistance molecular chain" means a molecule chain having a function to change its resistance, depending on whether an electric field exists or whether charges are injected thereinto.

Also, in this specification, "chemical bond" is a concept indicating covalent bond, ion bond, or metallic bond, but is not a concept indicting hydrogen bond or bond by van der Waals' forces.

First Embodiment

An organic molecular memory of this embodiment includes a first conductive layer, a second conductive layer, and an organic molecular layer interposed between the first conductive layer and the second conductive layer. The organic molecular layer includes charge-storage molecular chains. The charge-storage molecular chains include fused polycyclic groups.

According to this embodiment, the fused polycyclic groups are introduced into the organic molecular layer, to increase the relative permittivity of the organic molecular layer. Therefore, charges stored in the organic molecular layer are hardly pulled out of the organic molecular layer, and the charge retention properties of the organic molecular memory (hereinafter also referred to simply as the molecular memory) are improved.

Figure 1:
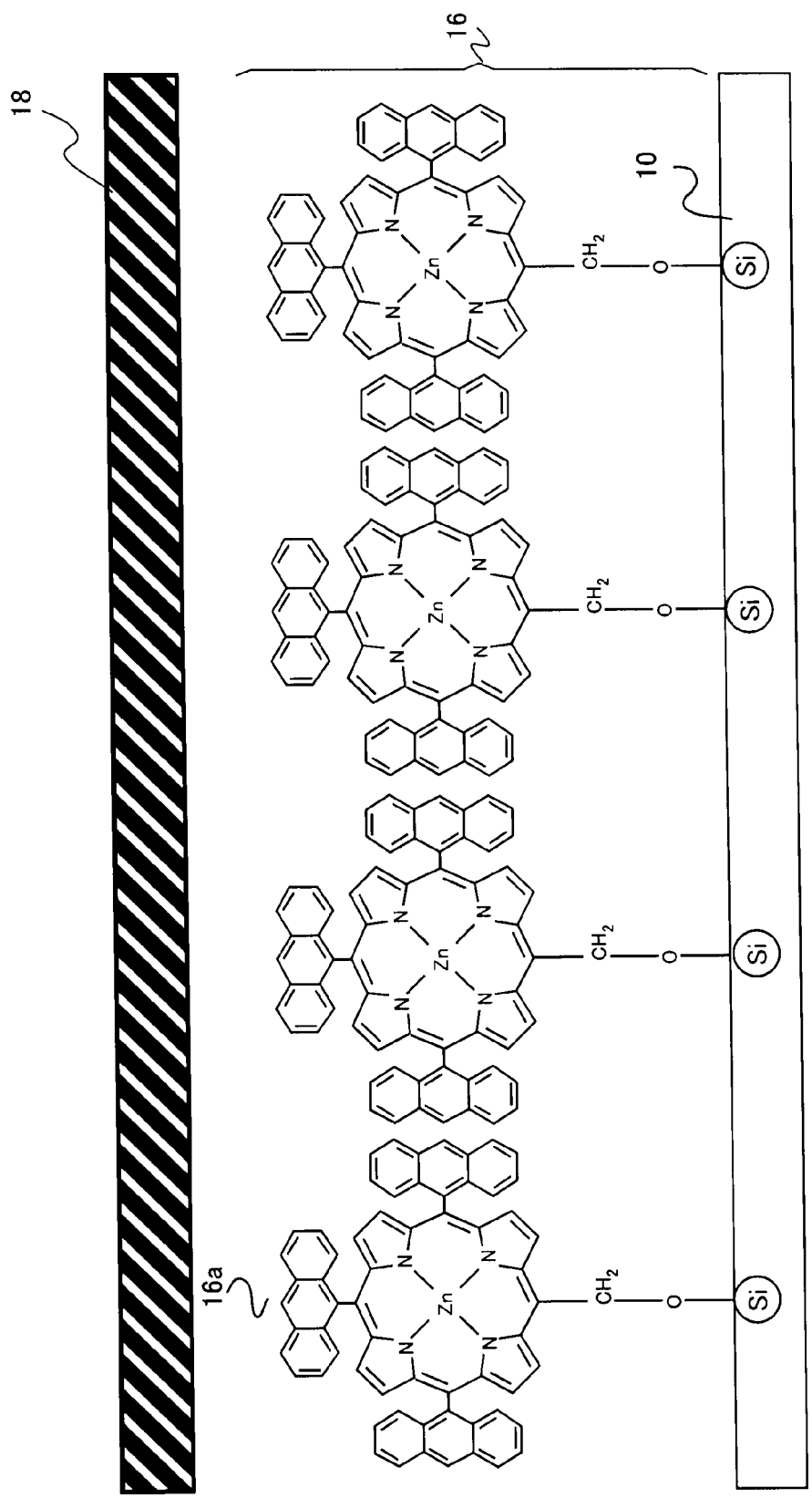
FIG. 1 is a schematic cross-sectional view of a memory cell portion of an organic molecular memory according to a first embodiment.
Figure 2:
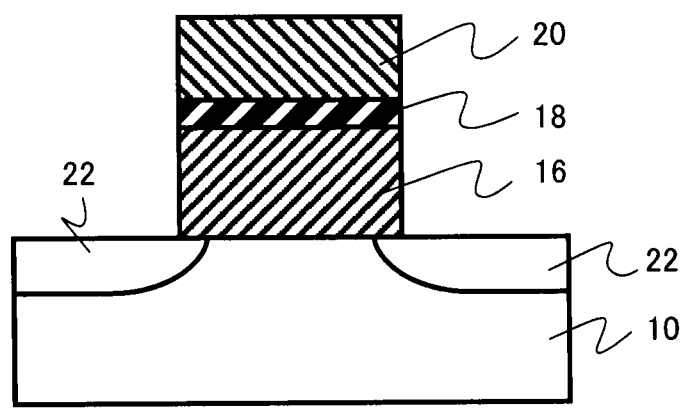
FIG. 2 is a schematic cross-sectional view of the organic molecular memory according to the first embodiment.

FIG. 1 is a schematic cross-sectional view of a memory cell portion of the organic molecular memory according to this embodiment. FIG. 2 is a schematic cross-sectional view of the organic molecular memory according to this embodiment. The organic molecular memory of this embodiment is a nonvolatile organic molecular memory of a stacked-gate type.

In the organic molecular memory of this embodiment, an organic molecular layer 16, a block insulating film (insulating layer) 18, and a gate electrode (a second conductive layer) 20 are formed on a silicon substrate (a first conductive layer or semiconductor layer) 10, for example. Source and drain regions 22 formed by diffusing an impurity are provided in portions of the silicon substrate 10 located on both sides of the stack structure. The organic molecular layer 16 formed above the silicon substrate (semiconductor layer) 10, the block insulating film (insulating layer) 18 formed above the organic molecular layer 16 and the gate electrode 20 formed above the block insulating film (insulating layer) 18.

The organic molecular layer 16 is formed with charge-storage molecular chains 16a and the molecular chains bond to the silicon substrate (semiconductor layer) 10. The charge-storage molecular chains 16a have a function to store charges in the molecular chains, and can switch between a state to store the charges and a state not to store the charges through application and removal of external voltage. The organic molecular layer 16 functions as a charge-storage electrode. The thickness of the organic molecular layer is 2 to 20 nm, for example.

The block insulating film 18 is a film stack of a silicon oxide film and a silicon nitride film, or a high-permittivity film, for example. The block insulating film 18 has a function to hinder movement of charges between the organic molecular layer 16 and the gate electrode 20.

In the organic molecular memory of this embodiment, a voltage is applied between the gate electrode 20 and the silicon substrate 10, to store charges into the organic molecular layer 16 or pull out the charges from the organic molecular layer 16. A memory cell functions, using changes in transistor threshold value depending on whether charges exist in the organic molecular layer 16.

Figure 3:
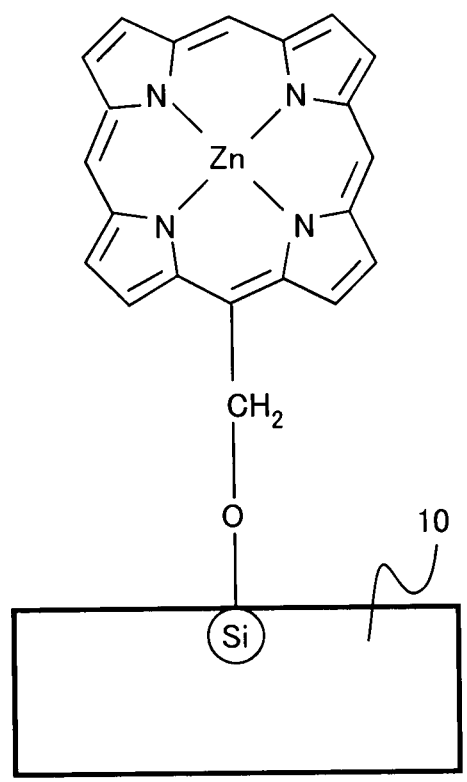
FIG. 3 is a diagram showing a molecular structure of a charge-storage molecular chain without fused polycyclic groups.

FIG. 3 is a diagram showing a molecular structure of a charge-storage molecular chain without fused polycyclic groups. In this embodiment, the organic molecular layer 16 of each memory cell portion contains organic molecules to which fused polycyclic groups are bound.

The charge-storage molecular chains 16a forming the organic molecular layer 16 of this embodiment have the molecular structures shown in FIG. 1, for example. The charge-storage molecular chains of FIG. 1 are derivatives of zinc porphyrin, which forms a charge-storage molecular chain as shown in FIG. 3.

The oxygen atom (O) at one end of each of the charge-storage molecular chains of FIGS. 1 and 3 is chemically bound to a silicon atom (Si) of the silicon substrate 10. Silicon atoms in the surface of the silicon substrate 10 and oxygen atoms (O) are bound together in this manner, to form the organic molecular layer 16 that is a so-called self-assembled monolayer (SAM). Meanwhile, the other end of each of the charge-storage molecular chains 16a is not chemically bound to the block insulating film 18.

Further, in the charge-storage molecular chains of FIG. 1, anthracene that is fused polycyclic groups are bound to the zinc porphyrin.

The fused polycyclic groups include pi-electrons that are free electrons basically scattered in a two-dimensional direction. As shown in FIG. 1, the organic molecules 16a secured at one point to the electrode by a linker can rotate about the linker serving as the rotational axis. Therefore, the pi-electrons scattered in the two-dimensional direction rotate so that the organic molecules 16a can cause apparent three-dimensional electronic polarization. The electronic polarization of the adjacent organic molecules 16a cancel the electric field formed by charges delocalized in the organic molecules 16a. Accordingly, the charge retention properties of the organic molecular memory are improved. It should be noted that, if the fused polycyclic groups are oriented in both the longitudinal and width direction of the molecular chains as shown in FIG. 1, the three-dimensional electronic polarization is strengthened, which is preferable.

As described above, in this embodiment, the charge-storage molecular chains include organic molecules with fused polycyclic groups as shown in FIG. 1, so that electronic polarization canceling the electric field is induced. In other words, the relative permittivity of the organic molecular layer 16 becomes higher. Because of this, the organic molecular layer 16 has higher relative permittivity than that achieved in a case where the charge-storage molecular chain of FIG. 3 is used, for example. As a result, the charge retention properties of the organic molecular memory are improved. It should be noted that the relative permittivity of the organic molecular layer using the charge-storage molecular chain of FIG. 3 is approximately 3.0.

Here, the relative permittivity of the organic molecular layer 16 can be appropriately set by adjusting the molecular structures, placement density, and the like of the charge-storage molecular chains 16a in the organic molecular layer 16.

Figure 4:
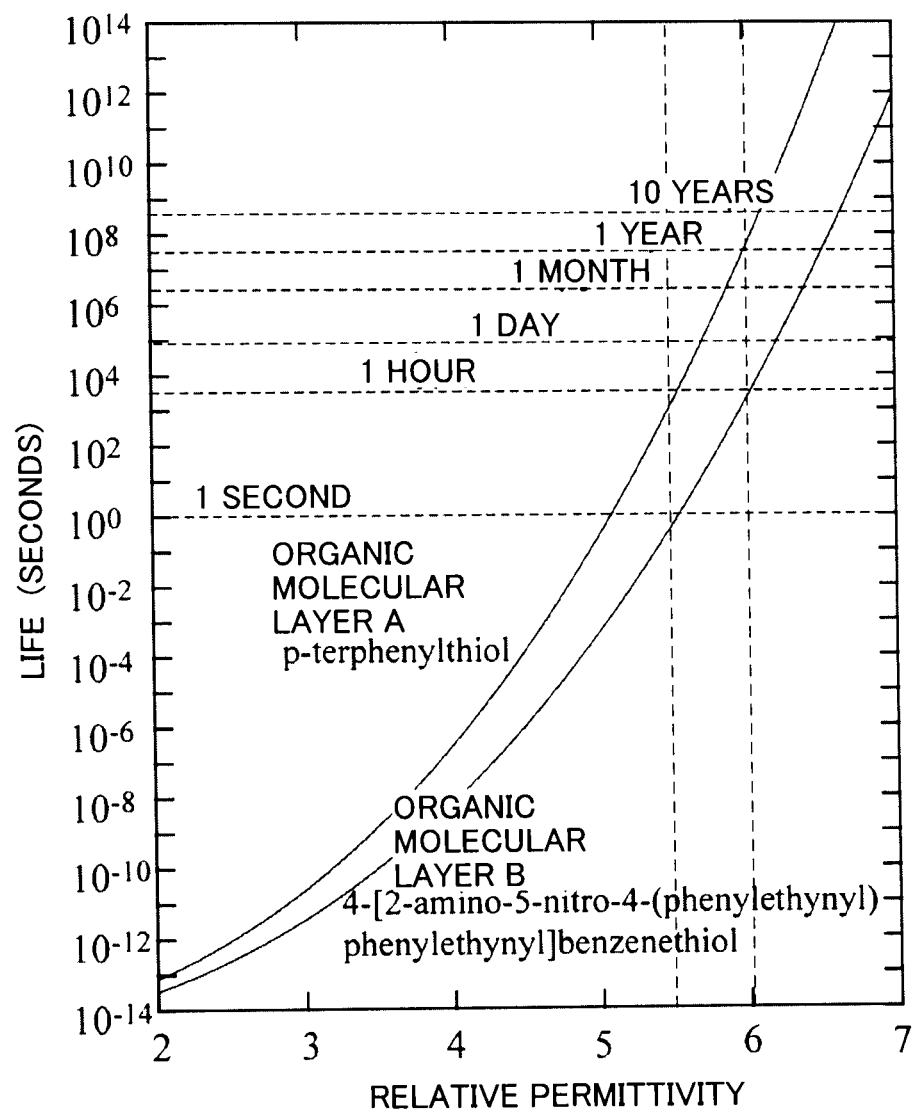
FIG. 4 shows graphs each representing the relationship between the relative permittivity and life of an organic molecular layer.
Figure 5A:
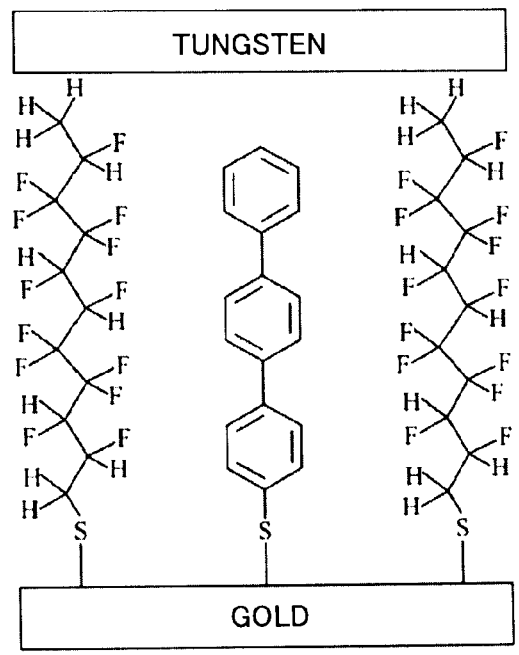
FIGS. 5A and 5B are diagrams showing the molecular structures of the organic molecular layers of FIG. 4.
Figure 5B:
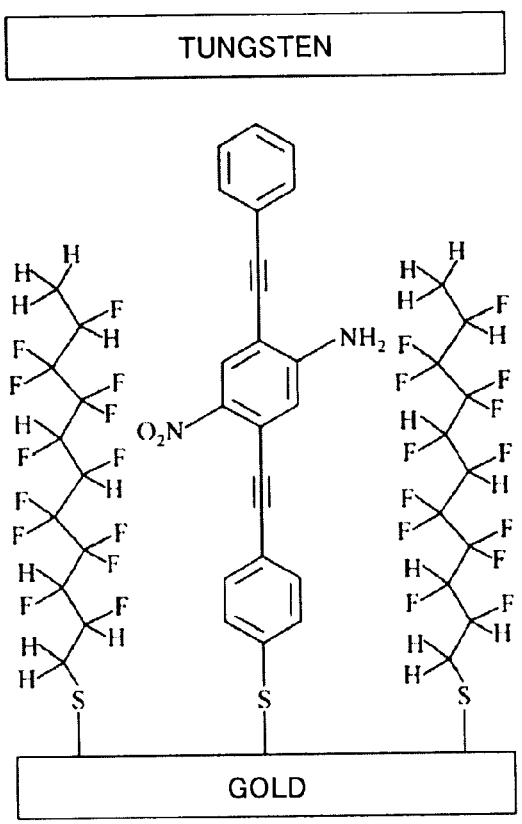

FIG. 4 shows graphs each representing the relationship between the relative permittivity and life (charge retention time) of an organic molecular layer. FIGS. 5A and 5B are diagrams showing the molecular structures of the organic molecular layers used in the measurement illustrated in FIG. 4. The graphs shown in FIG. 4 were calculated by using a later shown equation (2) based on the results obtained from the later described measurement (Measurement 1 and Measurement 2). It should be noted that the optical phonon frequency, $10^{15}(s^{-1})$, which is the theoretical upper limit, is used as the constant term $P_0$ of the equation (2). Therefore, the constant term represents the lower limit of the retention time.

FIG. 4 shows the charge retention times of the two organic molecular layers of FIGS. 5A and 5B where the relative permittivity of each of the organic molecular layers is changed. Specifically, the two samples are: the organic molecular layer of FIG. 5A (an organic molecular layer A in FIG. 4) that is formed with p-terphenylthiol, which is variable-resistance molecular chains, and fluoroalkylthiol with electron-withdrawing substituents; and the organic molecular layer of FIG. 5B (an organic molecular layer B in FIG. 4) that is formed with 4-[2-amino-5-nitro-4-(phenylethynyl)phenylethynyl]benzenethiol, which is variable-resistance molecular chains with electron-withdrawing substituents, and fluoroalkylthiol with electron-withdrawing substituents. Each of the two samples is interposed between gold as the lower electrode and tungsten as the upper electrode. The quantitative ratio between the variable-resistance molecular chains and the fluoroalkylthiol with electron-withdrawing substituents is varied, to change the relative permittivity of each of the organic molecular layers.

As shown in FIG. 4, when the relative permittivity of an organic molecular layer is 5.5 or higher, the charge retention time exceeds approximately 1 second, and preferred characteristics of a memory can be achieved. Further, when the relative permittivity becomes 6.0 or higher, the charge retention time exceeds one hour, and a more preferable charge retention time for a memory to be used can be realized. The charge retention time here is the period of time in which 37% of the initial characteristics change, and the measurement temperature is room temperature (300 K).

The relative permittivity of the organic molecular layer forming an organic molecular memory can be evaluated by applying an AC bias between the substrate and the gate electrode, and measuring the capacitance. At this point, the organic molecular layer thickness and the block insulating film thickness required for the relative permittivity calculation can be determined by observation with a TEM (Transmission Electron Microscope).

In the following, effects of this embodiment are described. It is considered that charges from the organic molecules in a memory cell interposed between electrodes (conductive layers) are cleared due to the following two mechanisms: 1) tunneling injection of charges of the opposite sign from the electrodes; and 2) hopping of charges from the molecules into the electrodes.

In this embodiment, the charge-storage molecular chains forming an organic molecular layer has fused polycyclic groups. Accordingly, the relative permittivity of the organic molecular layer becomes higher, and clearing of charges due to the above described mechanisms 1) and 2) is restrained.

First, the mechanism 1) is described. Charges are easily cleared by tunneling injection of charges of the opposite sign from the electrodes, because the electric field induced by the charges in the organic molecules is strong. Due to the strong electric field, the energy barrier between the molecules and the electrodes becomes lower, and the tunneling probability becomes higher. Therefore, charges are easily cleared from the organic molecular layer.

Figure 6:
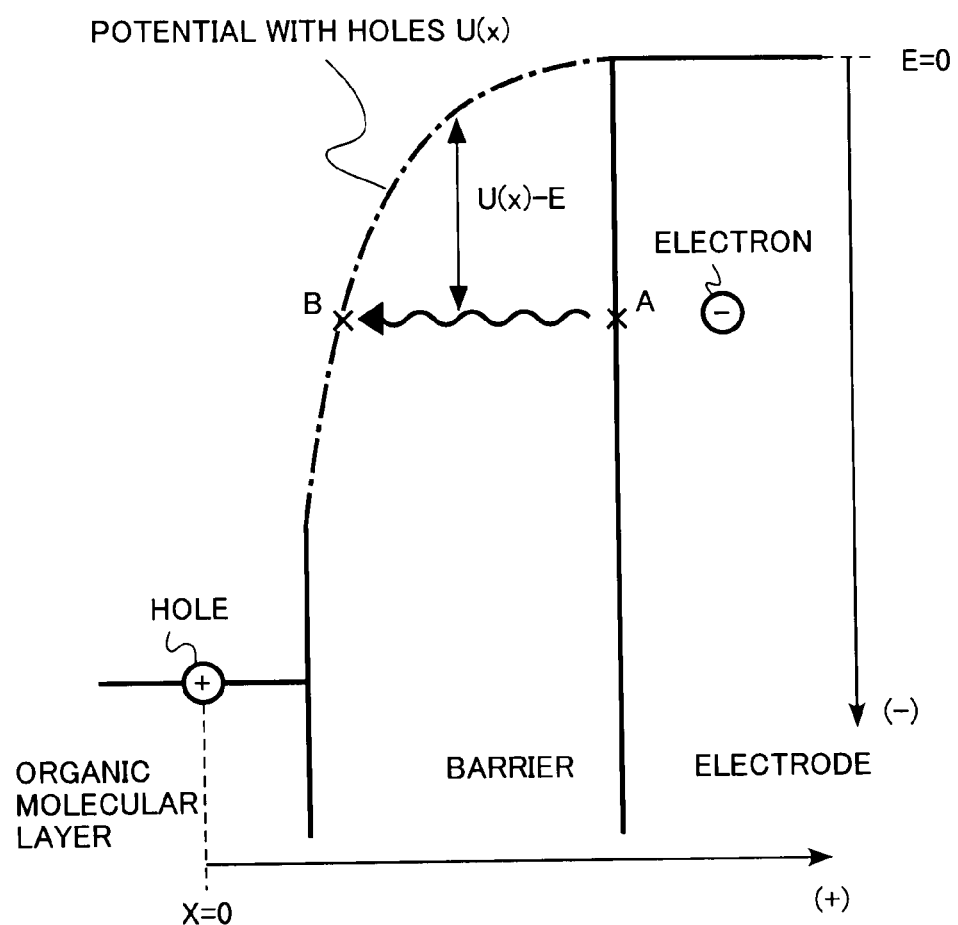
FIG. 6 is a diagram for explaining an effect of the first embodiment.

FIG. 6 is a diagram for explaining an effect of this embodiment. As shown in FIG. 6, when charges (holes in FIG. 6) exist in an organic molecular layer, carriers (electrons in the drawing) having charges of the opposite sign in the electrodes and the charges in the organic molecular layer attract each other. Accordingly, the potential barrier between the organic molecular layer and the electrodes becomes lower.

Where the potential barrier is represented by U(x), the probability that charges with an energy E in the electrode tunnel into the organic molecular layer is expressed by the following equation (1):

$$T \propto \exp\left(-\frac{4\pi}{h}\int_A^B \sqrt{2m(U(x)-E)}\, dx\right) \quad \text{[Equation 1]}$$

Here, $\pi$ represents the circumference ratio, h represents the Planck's constant, m represents the effective mass, and A and B are the two points where the potential U(x) has the value of the energy E and serve as the start point (A) and the end point (B) of the tunneling.

As can be seen from the equation (1), the tunneling probability becomes higher, as the distance between A and B (the potential width) becomes shorter and the difference between the potential and the energy (U(x)-E) becomes smaller. The distance between A and B becomes shorter as the change in U(x) becomes larger. Since the change in U(x) corresponds to the electric field, the distance between A and B becomes longer, and the tunneling probability becomes lower as the electric field becomes weaker.

Therefore, to restrain clearing of charges due to tunneling and facilitate charge retention, weakening the electric field is essential. As can be seen from the Maxwell's equations (the flux density conservation law), the electric field can be weakened by increasing the relative permittivity between the charges in the organic molecular layer and the electrodes. The portion between the charges in the organic molecular layer and the electrodes is the organic molecular layer. Therefore, by increasing the relative permittivity of the organic molecular layer, clearing of charges due to tunneling can be restrained.

In this embodiment, the charge-storage molecular chains are designed to include organic molecules with fused polycyclic groups. Accordingly, the relative permittivity of the organic molecular layer is made higher.

Figure 7:
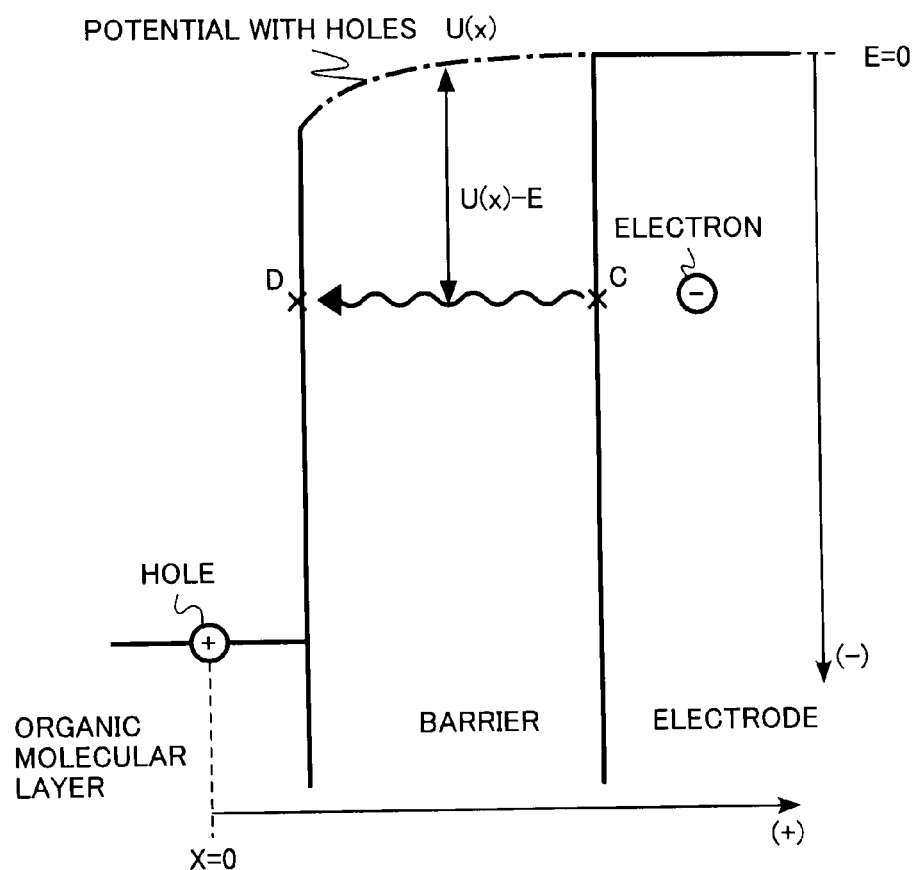
FIG. 7 is a diagram for explaining another effect of the first embodiment.

FIG. 7 is a diagram for explaining another effect of this embodiment. FIG. 7 is a diagram showing a change in the potential barrier in a case where an organic molecular layer has higher relative permittivity than that of FIG. 6.

In a case where charges having the same energy E as that of FIG. 6 tunnel from the electrodes into the organic molecular layer, the charges need to pass through the start point C and the end point D of the tunneling. The distance between C and D is longer than the distance between A and B of FIG. 6, and the difference between the potential and the energy (U(x)-E) is larger than that of FIG. 6. Therefore, the tunneling probability is lower than that of FIG. 6. Accordingly, the charge retention time becomes longer.

Next, the mechanism 2) is described. Where there is electronic polarization, the potential barrier becomes lower, and tunneling is restrained, as described above. Not only that, the polarization energy becomes larger. Accordingly, clearing due to escape of charges from the molecules to the electrodes by hopping is restrained.

Figure 8:
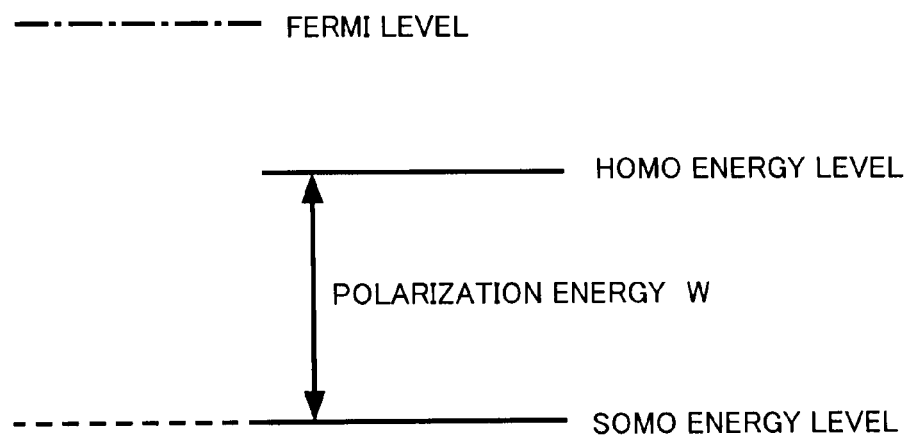
FIG. 8 is a diagram for explaining yet another effect of the first embodiment.

FIG. 8 is a diagram for explaining yet another effect of this embodiment.

Making an electric field smaller by electric dipoles is storing the energy of the electric field in the form of the polarization energy W of a dielectric material. The polarization energy W is the energy to be scattered around when charges are removed, and is equivalent to the difference between the HOMO (Highest Occupied Molecular Orbital) energy level and the SOMO (Singly Occupied Molecular Orbital) energy level from which one electron has been pulled out.

Therefore, the activation energy A required for the charges in an organic molecular layer to hop is equal to a half of the polarization energy W. Accordingly, by increasing the polarization energy W, the probability of outflow of charges hopping from molecules can be made lower. The outflow probability P can be expressed by the following equation (2):

$$P = P_0\exp\left(-\frac{A}{kT}\right) = P_0\exp\left(-\frac{W}{2kT}\right) \quad \text{[Equation 2]}$$

Here, $P_0$ represents the constant, and A represents the activation energy for removing charges.

In determining the polarization energy W, a local electric field, not a macroscopic electric field, needs to be used, with fluctuation of polarization at the molecular level being taken into account. Where $E_0$ represents the electric field without polarization, the local field E is expressed by the following equation (3):

$$E = \frac{\varepsilon + 2}{3} E_0 \qquad \text{[Equation 3]}$$

Accordingly, the polarization energy W is expressed by the following equation (4):

$$W = \int_0^D E \, dD = \varepsilon_r \varepsilon_0 \int_0^D E \, dE = \frac{\varepsilon_r \varepsilon_0}{2} \left(\frac{\varepsilon_r + 2}{3}\right)^2 E_0^2 \qquad \text{[Equation 4]}$$

As can be seen from the equation (4), the polarization energy W becomes larger as the relative permittivity becomes higher. As can be seen from the equation (2), the outflow probability P becomes lower as the polarization energy W becomes larger. Accordingly, hopping is restrained by increasing the relative permittivity. Thus, the charge retention time becomes longer.

In the following, the results of measurement of polarization energy and relative permittivity are described.

(Measurement 1)

A sample having a self-assembled film of terphenylthiol formed on a gold substrate is observed with a scanning tunneling microscope. As the top end of each molecule can be observed, a needle probe of the scanning tunneling microscope is put close to the top end of a molecule, and a bias is applied between the substrate and the needle probe. In this manner, the electric properties of a single molecule can be measured. Calculated from the result of measurement of current, the polarization energy (the activation energy) $W_1$ is 0.36 eV. The relative permittivity $\varepsilon_1$ of the terphenylthiol molecular group is 3.1 (a literature-based value).

(Measurement 2)

A sample having a self-assembled film formed on a gold substrate is observed with a scanning tunneling microscope. In the self-assembled film, the compound ratio by weight of terphenylthiol is 5% while the compound ratio by weight of hexanethiol is 95%. Since the molecular chains of terphenylthiol are longer than those of hexanethiol, a structure having the top end of a terphenylthiol molecule protruding from the sample is observed. A needle probe of the scanning tunneling microscope is put close to the top end of the molecule, and a bias is applied between the substrate and the needle probe. In this manner, the electric properties of a single molecule can be measured. Calculated from the result of measurement of current, the polarization energy (the activation energy) $W_2$ is 0.22 eV. The relative permittivity $\varepsilon_2$ of the hexanethiol is 2.3.

The effects of polarization energy can be confirmed by Measurement 1 and Measurement 2. The following equation (5) is established from the above measurement results:

$$\frac{W_1}{W_2} = \frac{0.36}{0.22} = 1.64 \qquad \text{[Equation 5]}$$

Meanwhile, according to the equation (4), the following equation (6) is established:

$$\frac{W_1}{W_2} = \frac{\varepsilon_1(\varepsilon_1 + 2)^2}{\varepsilon_2(\varepsilon_2 + 2)^2} = \frac{3.1(3.1 + 2)^2}{2.3(2.3 + 2)^2} = \frac{80.631}{48.668} = 1.66 \qquad \text{[Equation 6]}$$

The equation (5) and the equation (6) are the same within the margin of measurement error. In this manner, experiments confirm that the polarization energy (the activation energy) becomes larger as the relative permittivity is made higher.

As described above, according to this embodiment, clearing of charges due to movement of charges by tunneling and hopping is restrained. Accordingly, an organic molecular memory with excellent charge retention properties can be realized.

The charge-storage molecular chains of this embodiment are not limited to the molecular structures illustrated in FIG. 1, as long as fused polycyclic groups are bound to the charge-storage molecular chains.

Figure 9A:
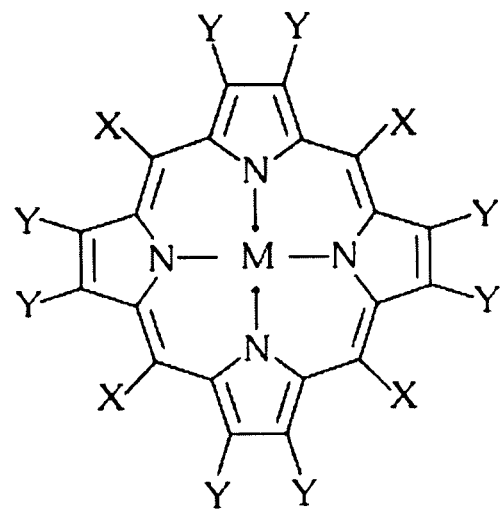
FIGS. 9A and 9B are diagrams showing example of molecular structures of the charge-storage molecular chains according to the first embodiment.
Figure 9B:
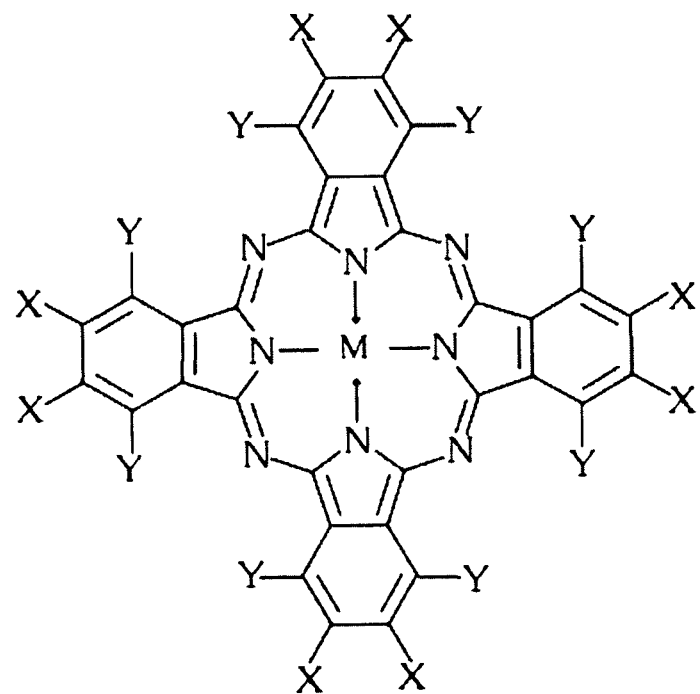

FIGS. 9A and 9B are diagrams showing examples of the molecular structures of the charge-storage molecular chains according to this embodiment. FIG. 9A shows metalloporphyrin and derivatives thereof. In the drawing, M represents a metal atom or a metallic compound, such as iron (Fe), cobalt (Co), nickel (Ni), or copper (Cu). Also, in the drawing, X and Y represent, independently of each other, fused polycyclic groups such as hydrogen atoms or anthracene, or electron-withdrawing substituents such as halogen atoms, cyano groups, carbonyl groups, or carboxyl groups. However, at least some of them are fused polycyclic groups.

FIG. 9B shows metallophthalocyanine and derivatives thereof. In the drawing, M represents a metal atom or a metallic compound, such as copper (Cu), cobalt (Co), iron (Fe), nickel (Ni), titanium oxide (TiO), or aluminum chloride (AlCl). Also, in the drawing, X and Y represent, independently of each other, fused polycyclic groups such as hydrogen atoms or anthracene, or electron-withdrawing substituents such as halogen atoms, cyano groups, carbonyl groups, or carboxyl groups. However, at least some of them are fused polycyclic groups.

Appropriate linkers in accordance with the material of the conductive layer to be subjected to the binding are bound to part of the charge-storage molecular chains of FIGS. 9A and 9B.

FIGS. 10A through 10F are diagrams showing examples of the fused polycyclic groups bound to the charge-storage molecular chains according to this embodiment. In the drawings, X, Y, Z, U, V, and W represent, independently of each other, hydrogen atoms, or electron-withdrawing substituents such as halogen atoms, cyano groups, carbonyl groups, or carboxyl groups. M represents a binding site with a charge-storage molecular chain.

Figure 10A:
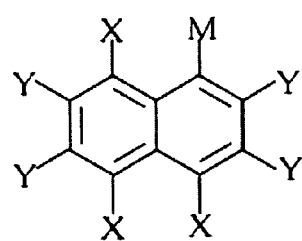
FIGS. 10A through 10F are diagrams showing examples of fused polycyclic groups bound to the charge-storage molecular chains according to the first embodiment.
Figure 10D:
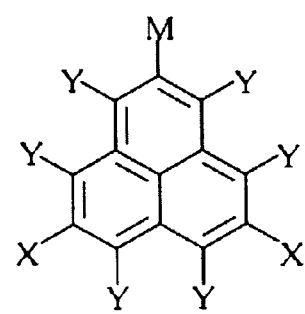
Figure 10B:
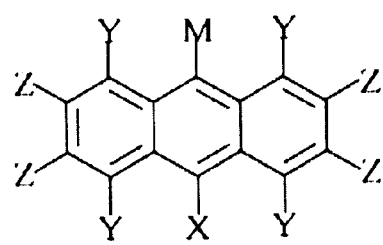
Figure 10E:
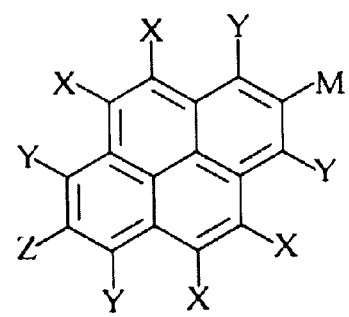
Figure 10C:
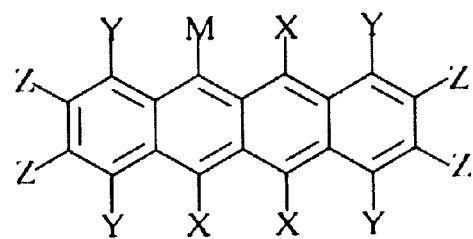
Figure 10F:
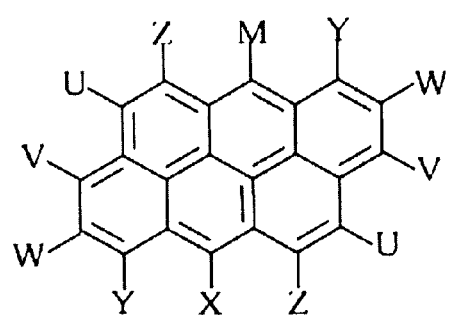

As the fused polycyclic groups bound to the charge-storage molecular chains, anthracene or derivatives thereof illustrated in FIG. 10B are preferable, because anthracene or derivatives thereof easily form symmetrical molecules, and increase the stability of the functions of the organic molecular memory.

Second Embodiment

An organic molecular memory of this embodiment is the same as the organic molecular memory of the first embodiment, except that electron-withdrawing substituents are further bound to the fused polycyclic groups bound to the charge-storage molecular chains. In the following, the same explanations as those of the substrate, electrodes, charge-storage molecular chains, fused polycyclic groups, and the like of the first embodiment will not be repeated.

Figure 11:
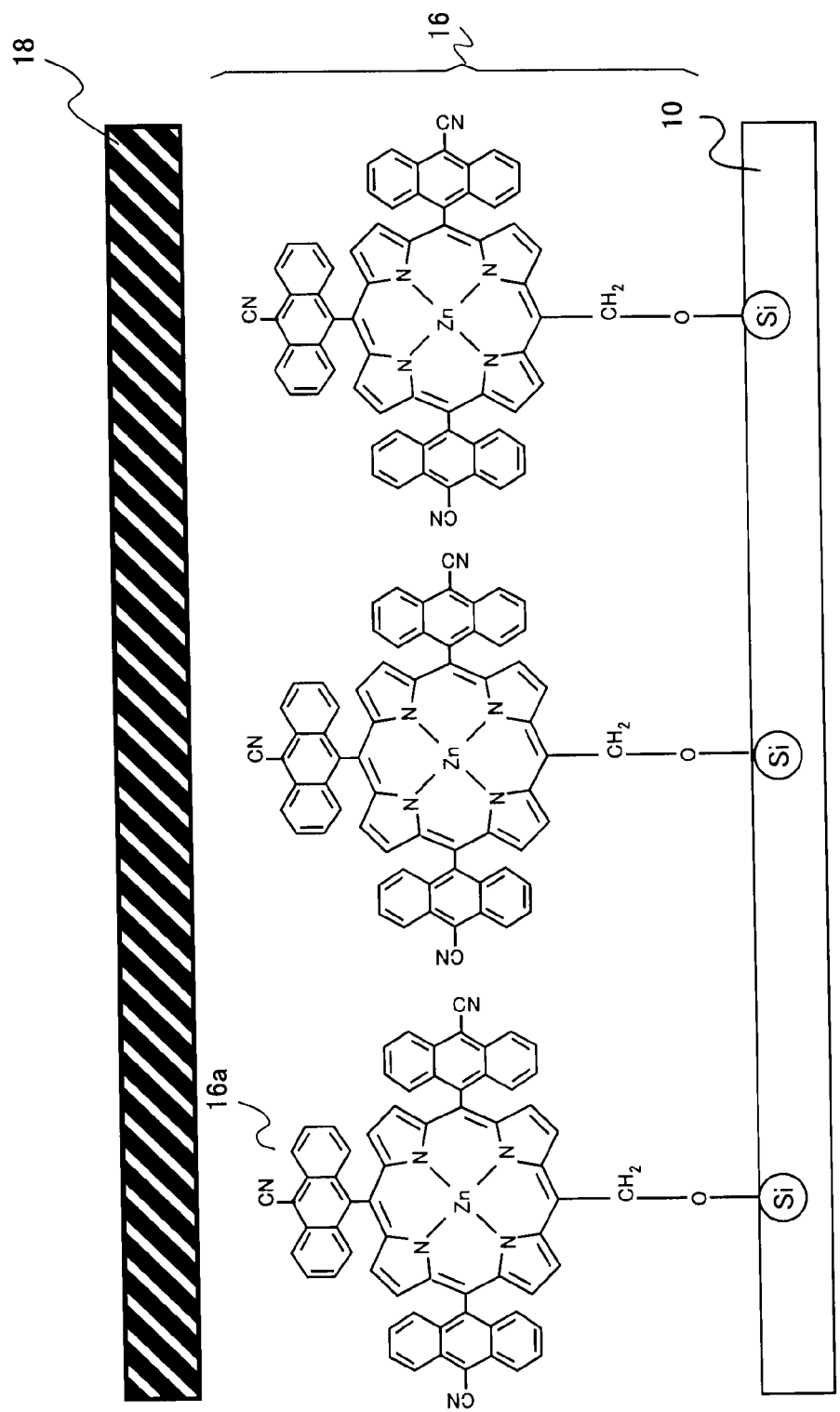
FIG. 11 is a schematic cross-sectional view of a memory cell portion of an organic molecular memory according to a second embodiment.

FIG. 11 is a schematic cross-sectional view of a memory cell portion of the organic molecular memory according to this embodiment. In this embodiment, electron-withdrawing substituents are further bound to the charge-storage molecular chains to which fused polycyclic groups are bound in the organic molecular layer 16 of each memory cell portion.

As shown in FIG. 11, anthracene as fused polycyclic groups is bound to zinc porphyrin, and cyano groups as electron-withdrawing substituents are bound to the anthracene, for example.

As the electron-withdrawing substituents are provided, electric dipoles are formed in the charge-storage molecular chains in this embodiment. The electric dipoles weaken the electric field induced by the charges in the charge-storage molecular chains 16a. Accordingly, the charge retention properties of the organic molecular memory are further improved by the same effects as the effects of the electronic polarization induced by the fused polycyclic groups described in the first embodiment.

In other words, having electron-withdrawing substituents in the molecules, the charge-storage molecular chains of this embodiment have a flexible, large electric dipole moment. Because of this, the relative permittivity of the organic molecular layer 16 can be made even higher than that achieved in a case where the charge-storage molecular chains of FIG. 1 are used, for example. As a result, the charge retention properties of the organic molecular memory are further improved by the same effects as those described in the first embodiment.

It should be noted that the electron-withdrawing substituents are not limited to the above described cyano groups. The electron-withdrawing substituents may be fluorine atoms (F), chlorine atoms (Cl), bromine atoms (Br), iodine atoms (I), cyano groups, nitro groups, amino groups, hydroxyl groups, carbonyl groups, or carboxyl groups, for example. Highly anionic groups can form large electric dipoles. Therefore, to increase the relative permittivity, it is preferable to use fluorine atoms, chlorine atoms, or cyano groups.

Third Embodiment

An organic molecular memory of this embodiment includes a first conductive layer, a second conductive layer, and an organic molecular layer interposed between the first conductive layer and the second conductive layer. The organic molecular layer includes first organic molecules with charge-storage molecular chains, and second organic molecules with fused polycyclic groups.

In the organic molecular memory of the first embodiment, the charge-storage molecular chains serving as memory elements have the fused polycyclic groups. On the other hand, the organic molecular memory of this embodiment includes organic molecules having the fused polycyclic groups in the organic molecular layer, as well as the charge-storage molecular chains serving as the memory elements in the organic molecular layer. In this aspect, this embodiment differs from the first embodiment. In the following, the same explanations as those of the substrate, electrodes, charge-storage molecular chains, electron-withdrawing substituents, and the like of the first embodiment will not be repeated.

Figure 12:
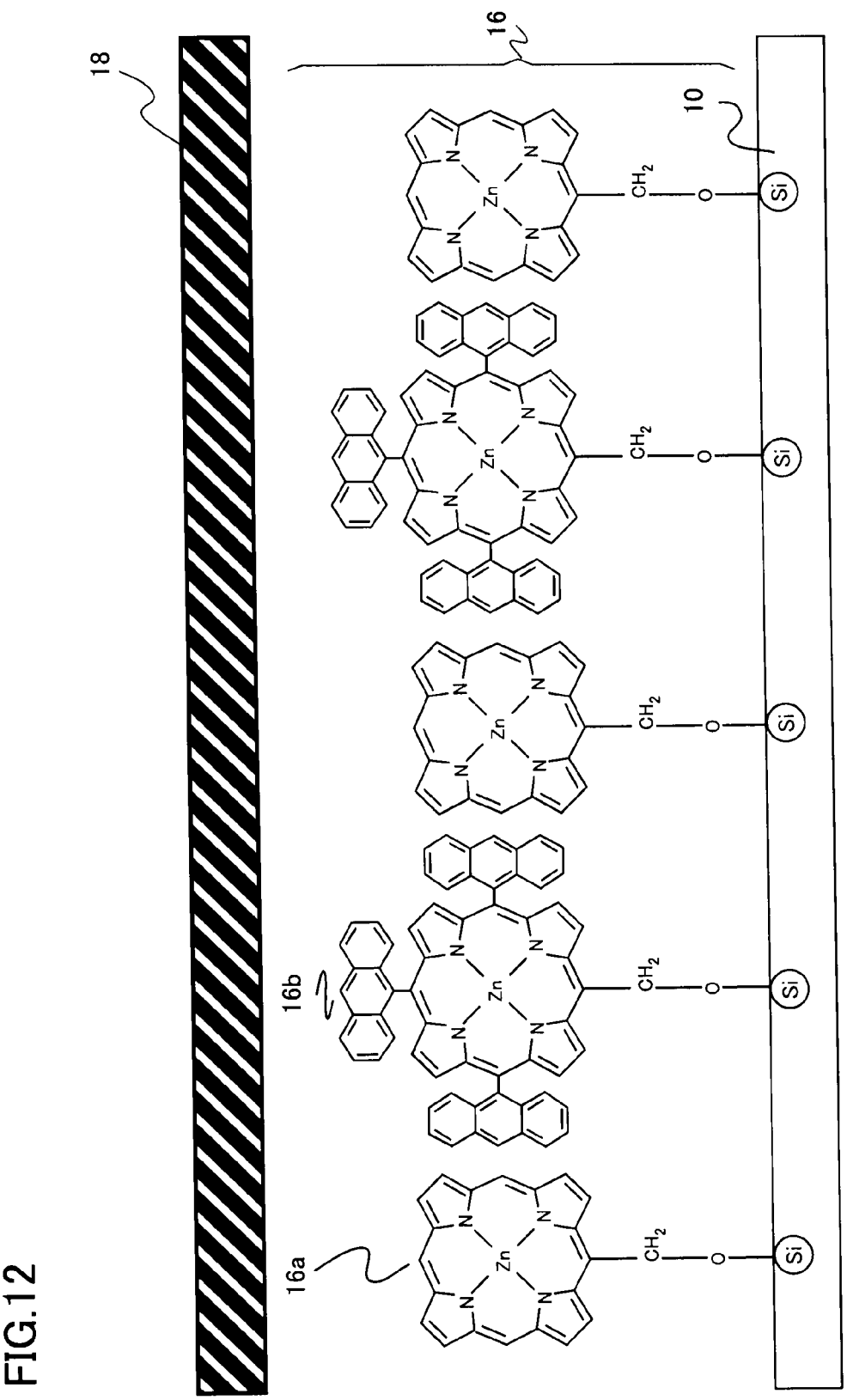
FIG. 12 is a schematic cross-sectional view of a memory cell portion of an organic molecular memory according to a third embodiment.

FIG. 12 is a schematic cross-sectional view of a memory cell (molecular cell) portion of the organic molecular memory according to this embodiment.

The organic molecular layer 16 is formed with charge-storage molecular chains (the first organic molecules) 16a and organic molecules (the second organic molecules) 16b with fused polycyclic groups.

As shown in FIG. 12, the charge-storage molecular chains 16a are zinc porphyrin, for example. The organic molecules 16b with fused polycyclic groups are zinc porphyrin derivatives to which anthracene is bound, for example.

In this embodiment, a memory cell is realized by using changes in the charge-stored state of the charge-storage molecular chains 16a. The electronic polarization in the organic molecules 16b with fused polycyclic groups weaken the electric field induced by the charges in the charge-storage molecular chains 16a. In other words, the relative permittivity of the organic molecular layer becomes higher than that achieved in a case where the organic molecular layer is formed only with the charge-storage molecular chains 16a. As a result, the charge retention properties of the organic molecular memory are improved by the same effects as those described in the first embodiment.

To improve the charge retention properties of the organic molecular memory, the relative permittivity is preferably 5.5 or higher, or more preferably, 6.0 or higher, as in the first embodiment.

The relative permittivity of the organic molecular layer 16 can be appropriately set by adjusting the molecular structures, placement densities, and the like of the charge-storage molecular chains 16a and the organic molecules 16b in the organic molecular layer 16.

The charge-storage molecular chains 16a and the organic molecules 16b of this embodiment are not limited to the above described structures. Any molecular chains that have a function to store charges in the molecular chains and can switch between a state to store the charges and a state not to store the charges by application and removal of external voltage suffice as the charge-storage molecular chains 16a.

For example, organic molecules each having either of the molecular structures illustrated in FIGS. 9A and 9B can be used. As the fused polycyclic groups, any of the molecular structures illustrated in FIGS. 10A through 10F can be used.

It should be noted that, in this embodiment, fused polycyclic groups may be or may not be bound to the charge-storage molecular chains 16a functioning as memory elements. Also, the organic molecules 16b with fused polycyclic groups may not be used as the molecules to realize the memory functions in cooperation with the charge-storage molecular chains 16a.

In the example case described above, derivatives of the charge-storage molecular chains 16a as the first organic molecules are used as the second organic molecules to which fused polycyclic groups are bound. As derivatives of the charge-storage molecular chains 16a are used as the organic molecules 16b with fused polycyclic groups, it is easy to form the organic molecular layer 16 as a self-assembled film having two kinds of organic molecules mixed therein. However, the second organic molecules may not be derivatives of the first organic molecules. The second organic molecules may be any organic molecules to which fused polycyclic groups are bound, other than charge-storage molecular chains.

Fourth Embodiment

An organic molecular memory of this embodiment is the same as the organic molecular memory of the third embodiment, except that electron-withdrawing substituents are further bound to the fused polycyclic groups bound to the charge-storage molecular chains. In the following, the same explanations as those of the substrate, electrodes, charge-storage molecular chains, fused polycyclic groups, and the like of the third embodiment will not be repeated.

Figure 13:
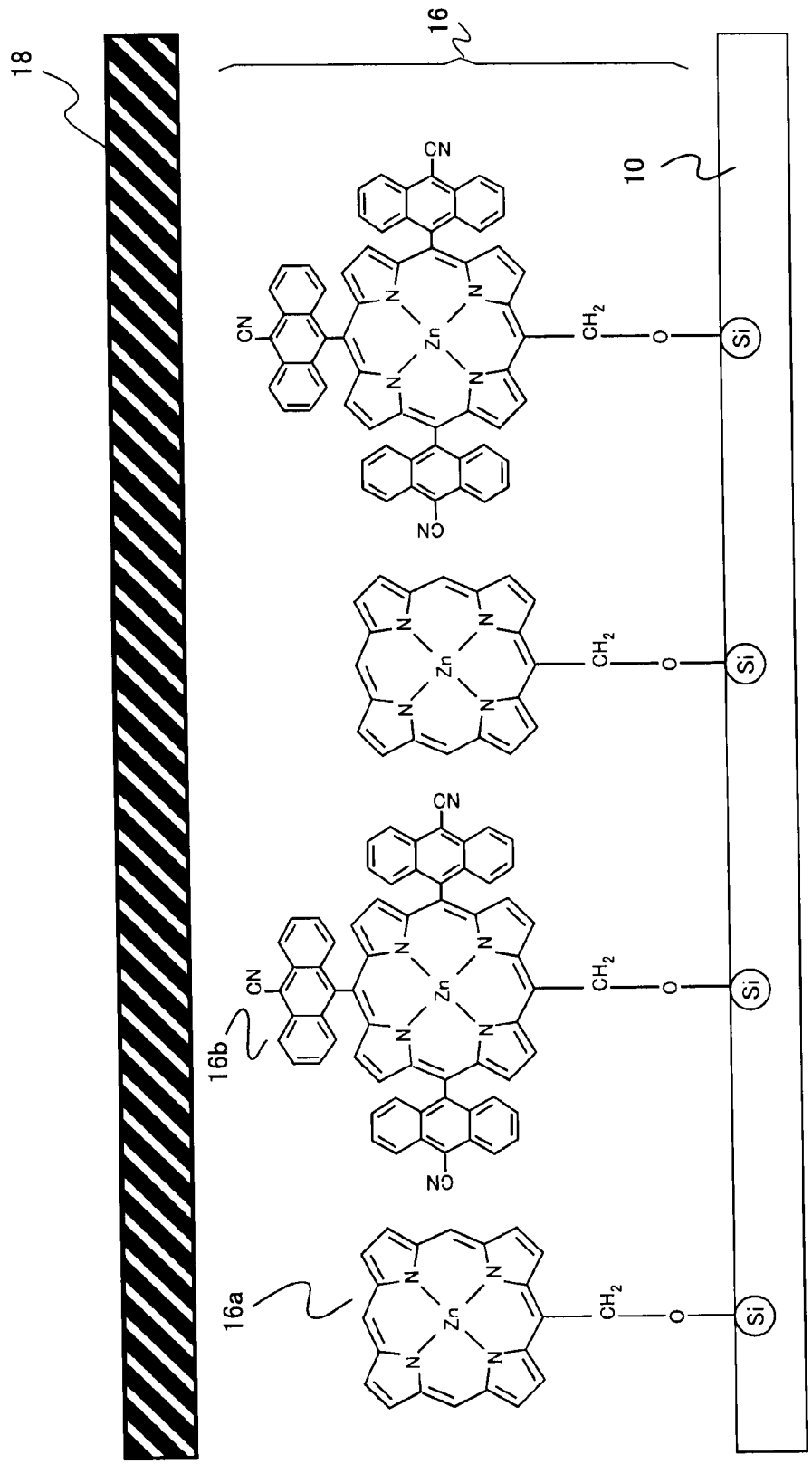
FIG. 13 is a schematic cross-sectional view of a memory cell portion of an organic molecular memory according to a fourth embodiment.

FIG. 13 is a schematic cross-sectional view of a memory cell portion of the organic molecular memory according to this embodiment. In this embodiment, electron-withdrawing substituents are further bound to the organic molecules (the second organic molecules) 16b with fused polycyclic groups in the organic molecular layer 16 of each memory cell portion.

As shown in FIG. 13, anthracene as fused polycyclic groups is bound to zinc porphyrin, and cyano groups as electron-withdrawing substituents are bound to the anthracene, for example.

As the electron-withdrawing substituents are provided, electric dipoles are formed in the organic molecules 16b with fused polycyclic groups in this embodiment. The electric dipoles weaken the electric field induced by the charges in the charge-storage molecular chains (the first organic molecules) 16a functioning as memory elements. Accordingly, the charge retention properties of the organic molecular memory are further improved by the same effects as the effects of the electronic polarization induced by the fused polycyclic groups described in the first embodiment.

As the second organic molecules have electron-withdrawing substituents, the energy level is changed for the first organic molecules having the memory functions, so that movement of charges from the first organic molecules to the second organic molecules can be restrained. Accordingly, the charge retention properties of the organic molecular memory are also improved in this aspect.

Fifth Embodiment

An organic molecular memory of this embodiment is a cross-point organic molecular memory using variable-resistance molecular chains, unlike the organic molecular memory of the first embodiment, which is a stacked-gate organic molecular memory using charge-storage molecular chains. In the following, the same explanations as those of the actions and effects to be achieved by electronic polarization, the actions and effects to be achieved by increasing relative permittivity, and the like described in the first embodiment will not be repeated.

Figure 15:
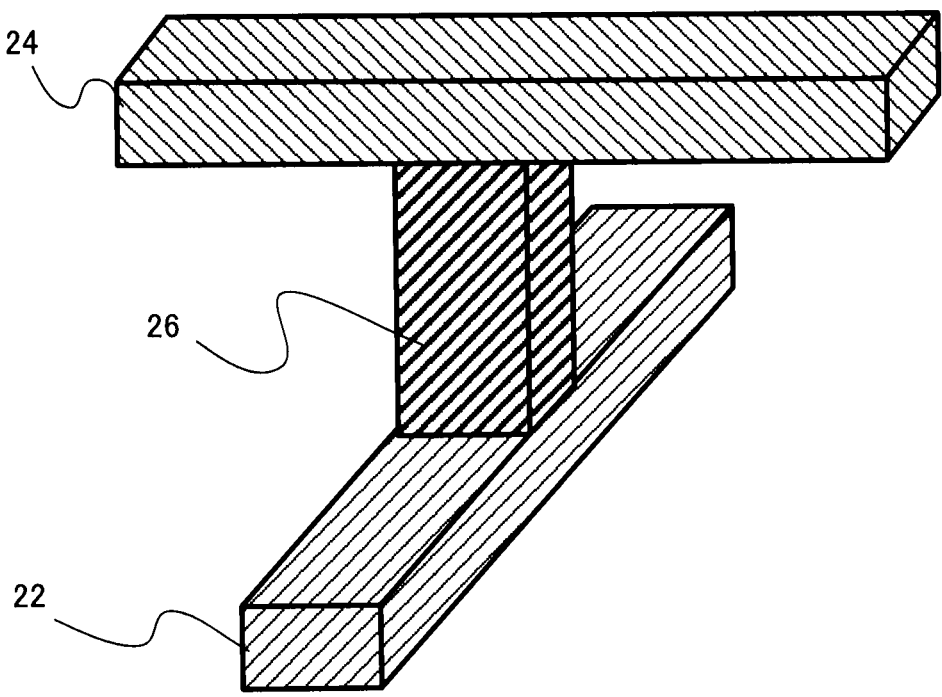
FIG. 15 is a schematic perspective view of an organic molecular memory according to the fifth embodiment.
Figure 16:
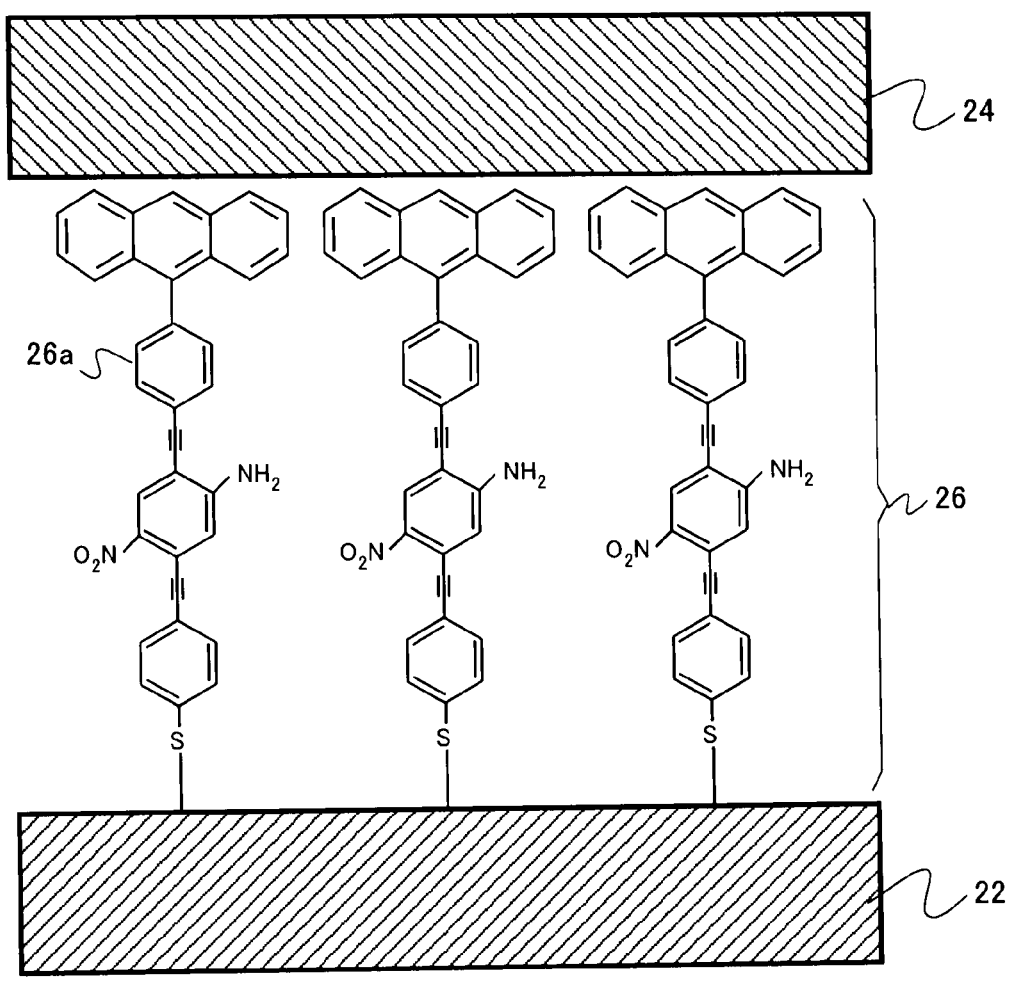
FIG. 16 is a schematic cross-sectional view of a memory cell portion of the organic molecular memory according to the fifth embodiment.

FIG. 15 is a schematic perspective view of the organic molecular memory according to this embodiment. FIG. 16 is a schematic cross-sectional view of a memory cell (molecular cell) portion of the organic molecular memory.

The molecular memory of this embodiment is a cross-point molecular memory. As shown in FIGS. 15 and 16, a lower electrode interconnect (a first conductive layer) 22 is provided on an upper portion of a substrate (not shown), for example. An upper electrode interconnect (a second conductive layer) 24 is positioned so as to intersect with the lower electrode interconnect 22. The rules in design of the electrode interconnects specify 5 to 20 nm, for example.

As shown in FIGS. 15 and 16, an organic molecular layer 26 is provided at an intersection portion between the lower electrode interconnect 22 and the upper electrode interconnect 24, and in between the lower electrode interconnect 22 and the upper electrode interconnect 24. Variable-resistance molecular chains 26a form the organic molecular layer 26. The thickness of the organic molecular layer is 1 to 20 nm, for example.

The organic molecular layer 26 is provided at each of the intersection points between lower electrode interconnects 22 and upper electrode interconnects 24 as shown in FIG. 15, for example, to form memory cells. With this arrangement, a memory cell array formed with memory cells is realized.

In this embodiment, each organic molecular layer 26 is designed to include organic molecules with fused polycyclic groups. Accordingly, the relative permittivity of each organic molecular layer 26 becomes higher. To improve the charge retention properties of the organic molecular memory, the relative permittivity of each organic molecular layer 26 is preferably 5.5 or higher, or more preferably, 6.0 or higher.

As shown in FIG. 16, each organic molecular layer 26 of this embodiment is formed with the variable-resistance molecular chains 26a. One end of each variable-resistance molecular chain 26a is chemically bound to the lower electrode interconnect 22.

The lower electrode interconnect 22 is formed on a silicon (Si) substrate (not shown) having the (110) plane as a surface, for example. The lower electrode interconnect 22 is made of a metallic material such as gold (Au). The face of the lower electrode interconnect 22 in contact with the organic molecular layers 26 is the (111) plane, for example. The upper electrode interconnect 24 is made of a metallic material such as molybdenum (Mo).

Figure 14A:
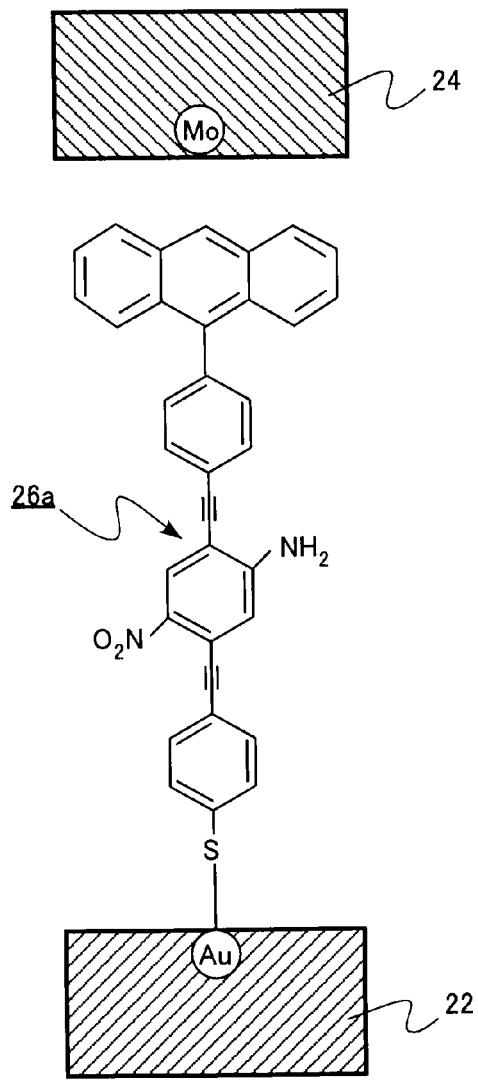
FIG. 14A is a diagram showing a molecular structure of an organic molecule in a memory cell portion according to a fifth embodiment.
Figure 14B:
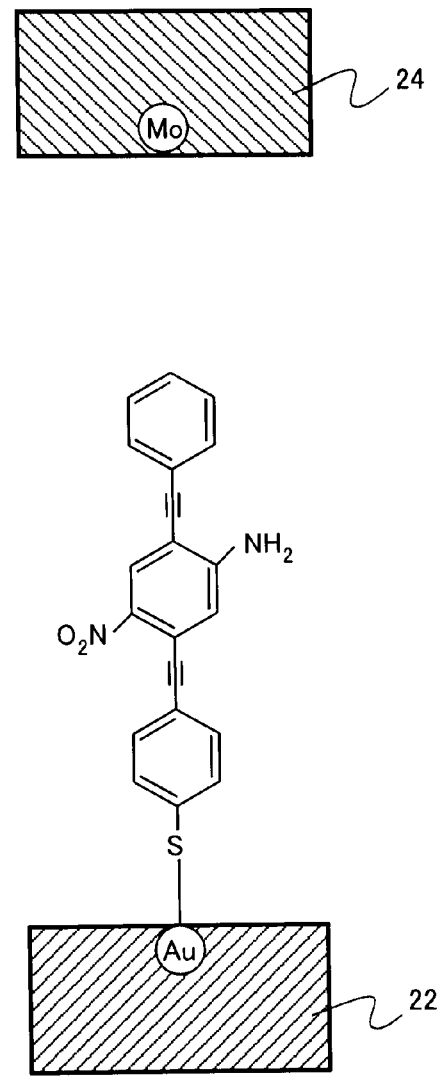
FIG. 14B is a diagram showing a molecular structure of an organic molecule in a memory cell portion in a case where no fused polycyclic groups are provided.

FIGS. 14A and 14B are diagrams showing molecular structures of organic molecules in memory cell portions. FIG. 14A shows organic molecules of this embodiment, and FIG. 14B shows organic molecules in a case where fused polycyclic groups are not provided. In this embodiment, the organic molecular layer 26 of each memory cell portion contains organic molecules to which fused polycyclic groups are bound.

Each of the variable-resistance molecular chains 26a forming the organic molecular layers 26 of this embodiment has the molecular structure shown in FIG. 14A, for example. The variable-resistance molecular chain of FIG. 14A is a derivative of the variable-resistance molecular chain without fused polycyclic groups as shown in FIG. 14B, which is 4-[2-nitro-5-amino-4-(phenylethynyl)phenylethynyl]benzenethiol. A variable-resistance molecular chain having the molecule structure shown in FIG. 14B is also called a "tour wire".

A thiol group exists as a linker at one end of each of the variable-resistance molecular chains of FIGS. 14A and 14B, and a sulfur atom (S) and a gold atom (Au) in the surface of the lower electrode interconnect 22 are chemically bound together. Here, "linker" means a site that secures a molecule to an electrode (a conductive layer) through chemical bond.

Gold atoms in the surface of the lower electrode 22 and thiol groups are bound together in this manner, to form each organic molecular layer 26 that is a so-called self-assembled monolayer (SAM). Meanwhile, the other end of each variable-resistance molecular chain 26a is not chemically bound to molybdenum (Mo) atoms in the surface of the upper electrode 24.

Further, anthracene as a fused polycyclic group is bound to the variable-resistance molecular chain 26a of FIG. 14A.

Here, each variable-resistance molecular chain 26a is a molecule chain having a function to change its resistance, depending on whether an electric field exists or whether charges are injected thereinto. For example, each variable-resistance molecular chain having the molecular structure shown in FIG. 14A or 14B can switch between a low-resistance state and a high-resistance state through voltage application between both ends. Such changes in the resistance state are used to realize a memory cell.

In this embodiment, the variable-resistance molecular chains contain fused polycyclic groups, as shown in FIG. 14A. As the fused polycyclic groups are provided in this manner, the variable-resistance molecular chains of this embodiment have electronic polarization. Because of this, the relative permittivity of each organic molecular layer 26 becomes higher than that achieved in a case where the variable-resistance molecular chain of FIG. 14B is used, for example. As a result, the charge retention properties of the organic molecular memory are improved as described above. The relative permittivity of each organic molecular layer in the case where the variable-resistance molecular chain of FIG. 14B is approximately 3.0.

The relative permittivity of each organic molecular layer 26 can be appropriately set by adjusting the molecular structures, placement density, and the like of the variable-resistance molecular chains 26a in the organic molecular layer 26.

The variable-resistance molecular chains of this embodiment do not necessarily have the molecular structure illustrated in FIG. 14A, as long as fused polycyclic group are bound to the variable-resistance molecular chains. First, as variable-resistance molecular chains to which fused polycyclic groups can be bound, molecules having a n(pi)-conjugated system extending in a one-dimensional direction can be used. For example, it is possible to use 4-[2-nitro-5-amino-4-(phenylethynyl)phenylethynyl]benzenethiol illustrated in FIG. 14B or derivatives thereof, or paraphenylene derivatives, oligothiophene derivatives, oligopyrrole derivatives, oligofuran derivatives, paraphenylenevinylene derivatives, or the like.

Figure 17A:
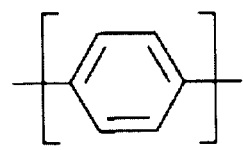
FIGS. 17A through 17F show examples of molecular units that can form molecules each having the π-conjugated system extending in a one-dimensional direction in the fifth embodiment.
Figure 17B:
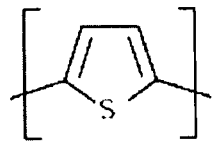
Figure 17C:
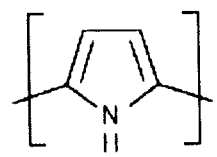
Figure 17D:
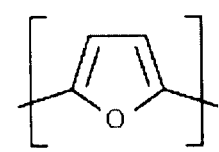
Figure 17E:
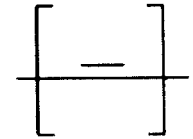
Figure 17F:
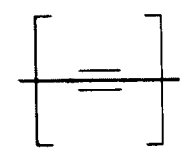

FIGS. 17A through 17F show examples of molecular units that can form molecules each having the n-conjugated system extending in a one-dimensional direction. FIG. 17A shows paraphenylene, FIG. 17B shows thiophene, FIG. 17C shows pyrrole, FIG. 17D shows furan, FIG. 17E shows vinylene, and FIG. 17F shows alkyne.

In a case where the length of the n-conjugated system is short, electrons injected from electrodes do not stay on the molecules, and the electrons simply pass by the molecules. Therefore, to store charges, each molecule preferably has a certain length. The number of —CH═CH— unit in the molecule in a one-dimensional direction is preferably 5 or more. This is equivalent to 3 or more in the case of benzene rings (paraphenylene).

In a case where the n-conjugated system is long, a voltage drop due to charge conduction among the molecules becomes a problem. Therefore, the number of a —CH═CH— unit in the molecule in a one-dimensional direction is preferably 20 or less (ten benzene rings=twice the spread width of polaron as the carrier of the n-conjugated system).

The materials of the above described electrodes (the conductive layers) forming the organic molecular memory are not particularly limited to the above described gold and molybdenum. In the electrode (the lower electrode interconnect 22 in this embodiment) to which the linker at one end of each variable-resistance molecular chain 26a is chemically bound, at least the regions to which the variable-resistance molecular chains 26a are chemically bound are preferably made of a material with which the one end of each of the variable-resistance molecular chains 26a easily forms a chemical bond, so as to form a self-assembled film. Also, in the electrode (the upper electrode interconnect 24 in this embodiment) on the side of the other end of each of the variable-resistance molecular chains 26a, at least the regions facing the variable-resistance molecular chains 26a are preferably made of a material that does not easily form chemical bonds with one ends of the variable-resistance molecular chains 26a, so as to form an organic molecular layer by using a self-organizing process after the electrode formation.

The preferred electrode material varies depending on the structure of the linker at the one end of each variable-resistance molecular chain 26a. For example, in a case where the one end is a thiol group as shown in FIGS. 14A and 14B, the electrode on the chemical bond side is preferably gold (Au), silver (Ag), copper (Cu), tungsten (W), tungsten nitride (WN), tantalum nitride (TaN), or titanium nitride (TiN). Among those materials, gold (Au), silver (Ag), and tungsten (W), which easily form chemical bonds, are particularly preferable. Meanwhile, the electrode at the other end is preferably tantalum (Ta), molybdenum (Mo), molybdenum nitride (MoN), or silicon (Si).

In a case where the one end is an alcohol group or a carboxyl group, for example, the electrode on the chemical bond side is preferably tungsten (W), tungsten nitride (WN), tantalum (Ta), tantalum nitride (TaN), molybdenum (Mo), molybdenum nitride (MoN), or titanium nitride (TiN). Among those materials, tantalum (Ta), tantalum nitride (TaN), molybdenum nitride (MoN), and titanium nitride (TiN), which easily form chemical bonds, are particularly preferable. Meanwhile, the electrode at the other end is preferably gold (Au), silver (Ag), copper (Cu), or silicon (Si).

In a case where the one end is a silanol group, for example, the electrode on the chemical bond side is preferably silicon (Si) or a metal oxide. Meanwhile, the electrode at the other end is preferably gold (Au), silver (Ag), copper (Cu), tungsten (W), tungsten nitride (WN), tantalum (Ta), tantalum nitride (TaN), molybdenum (Mo), molybdenum nitride (MoN), or titanium nitride (TiN).

Alternatively, graphene or carbon nanotube can be used as the electrode material.

Sixth Embodiment

An organic molecular memory of this embodiment includes a first conductive layer, a second conductive layer, and an organic molecular layer interposed between the first conductive layer and the second conductive layer. The organic molecular layer includes second organic molecules with variable-resistance molecular chains, and first organic molecules with fused polycyclic groups.

While the organic molecular memory of the fifth embodiment includes variable-resistance molecular chains as memory elements with fused polycyclic groups, the organic molecular memory of this embodiment includes organic molecules with fused polycyclic groups in each organic molecular layer, as well as the variable-resistance molecular chains as the memory elements in each organic molecular layer. In this aspect, this embodiment differs from the fifth embodiment. In the following, the same explanations as those of the substrate, electrodes, variable-resistance molecular chains, fused polycyclic groups, and the like of the fifth embodiment will not be repeated.

Figure 18:
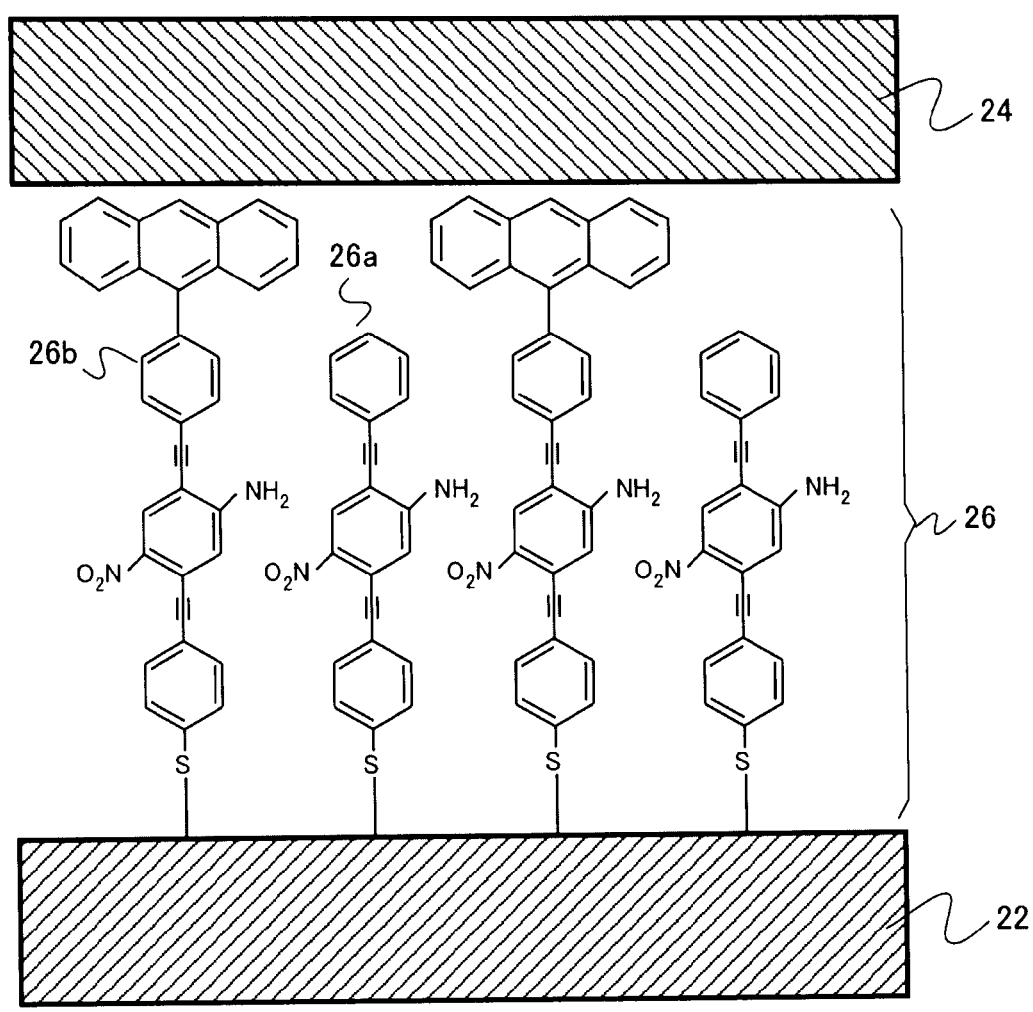
FIG. 18 is a schematic cross-sectional view of a memory cell portion of an organic molecular memory according to a sixth embodiment.

FIG. 18 is a schematic cross-sectional view of a memory cell (molecular cell) portion of the organic molecular memory according to this embodiment.

Each organic molecular layer 26 is formed with variable-resistance molecular chains (the second organic molecules) 26a and organic molecules (the first organic molecules) 26b with fused polycyclic groups.

The variable-resistance molecular chains 26a are 4-[2-nitro-5-amino-4-(phenylethynyl)phenylethynyl]benzenethiol illustrated in FIG. 14B, for example. The organic molecules 26b with fused polycyclic groups are derivatives of 4-[2-nitro-5-amino-4-(phenylethynyl)phenylethynyl]benzenethiol having anthracene bound thereto, as shown in FIG. 14A, for example.

In this embodiment, changes in the resistance states of the variable-resistance molecular chains 26a are used to realize memory cells. The electronic polarization in the organic molecules 26b with fused polycyclic groups weaken the electric field induced by the charges in the variable-resistance molecular chains 26a. Accordingly, the charge retention properties of the organic molecular memory are improved by the same effects as those described in the first embodiment.

In this embodiment, the organic molecules 26b include fused polycyclic groups. Because of this, the relative permittivity of each organic molecular layer becomes higher than that in a case where each organic molecular layer is formed only with the variable-resistance molecular chains 26a, for example. As a result, the charge retention properties of the organic molecular memory are improved by the same effects as those described in the first embodiment.

To improve the charge retention properties of the organic molecular memory, the relative permittivity is preferably 5.5 or higher, or more preferably, 6.0 or higher, as in the first embodiment.

The relative permittivity of each organic molecular layer 26 can be appropriately set by adjusting the molecular structures, placement densities, and the like of the variable-resistance molecular chains 26a and the organic molecules 26b in each organic molecular layer 26.

The variable-resistance molecular chains 26a and the organic molecules 26b of this embodiment are not limited to the above described structures. Any molecular chains that have a function to change their resistance depending on the existence of an electric field or injection of charges suffice as the variable-resistance molecular chains 26a.

It should be noted that, in this embodiment, fused polycyclic groups may be or may not be bound to the variable-resistance molecular chains 26a. Also, the organic molecules 26b with fused polycyclic groups may not be used as the molecules to realize the memory functions in cooperation with the variable-resistance molecular chains 26a.

In the example case described above, derivatives of the variable-resistance molecular chains 26a as the second organic molecules are used as the first organic molecules to which fused polycyclic groups are bound. In other words first and second organic molecules have the variable-resistance molecular chains of same carbon skeleton. As derivative structures of the variable-resistance molecular chains 26a are used as the organic molecules 26b with fused polycyclic groups as described above, it is easy to form each organic molecular layer 26 as a self-assembled film having two kinds of organic molecules mixed therein. However, the first organic molecules may not be derivatives of the second organic molecules. The first organic molecules may be any organic molecules to which fused polycyclic groups are bound, other than variable-resistance molecular chains.

Seventh Embodiment

An organic molecular memory of this embodiment is the same as the organic molecular memory of the sixth embodiment, except that electron-withdrawing substituents are further bound to the fused polycyclic groups of the first organic molecules having the fused polycyclic groups. In the following, the same explanations as those of the substrate, electrodes, variable-resistance molecular chains, fused polycyclic groups, and the like of the sixth embodiment will not be repeated.

Figure 19:
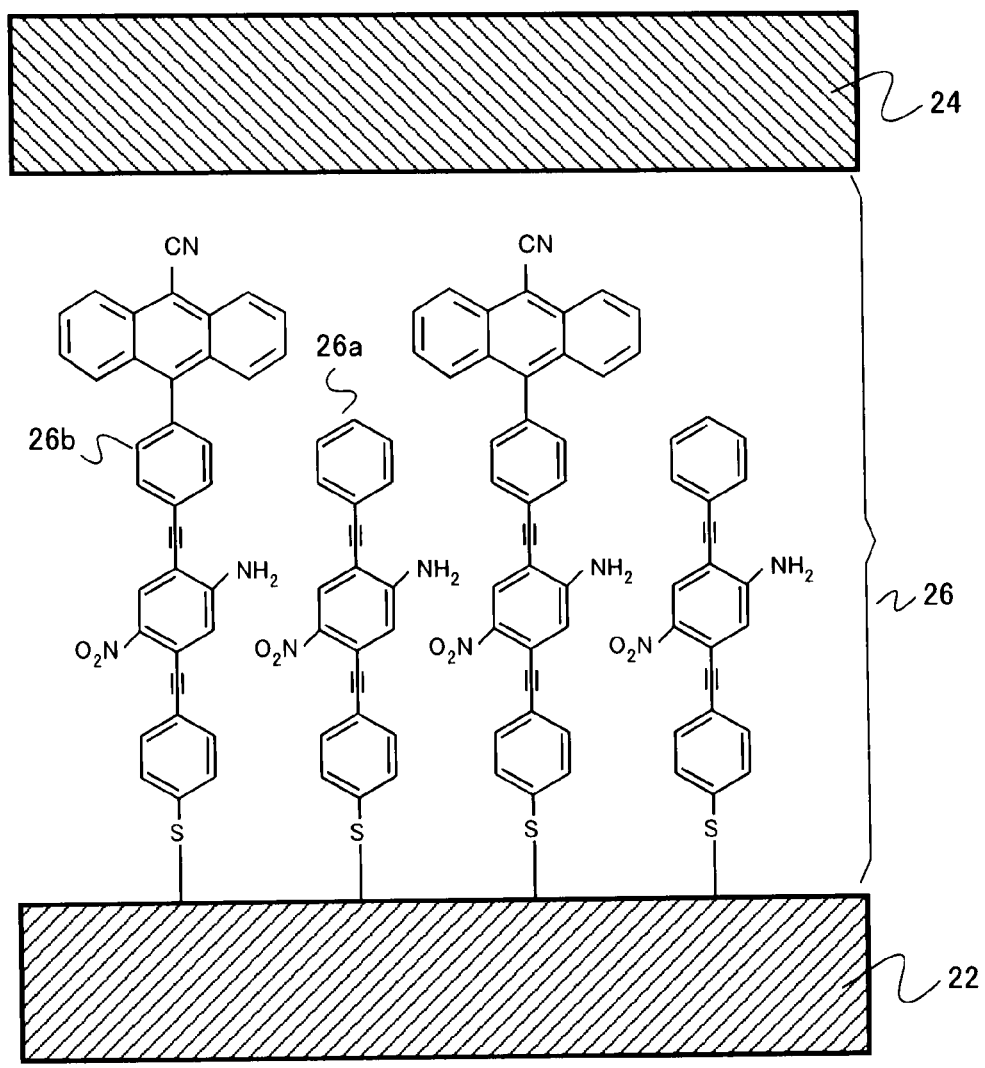
FIG. 19 is a schematic cross-sectional view of a memory cell portion of an organic molecular memory according to a seventh embodiment.

FIG. 19 is a schematic cross-sectional view of a memory cell portion of the organic molecular memory according to this embodiment. In this embodiment, electron-withdrawing substituents are further bound to the organic molecules (the first organic molecules) 26b with fused polycyclic groups in the organic molecular layer 26 of each memory cell portion.

As shown in FIG. 19, anthracene as fused polycyclic groups is bound to the organic molecules 26b, and cyano groups as electron-withdrawing substituents are bound to the anthracene, for example.

As the electron-withdrawing substituents are provided, electric dipoles are formed in the organic molecules 26b with fused polycyclic groups in this embodiment. The electric dipoles weaken the electric field induced by the charges in the variable-resistance molecular chains (the second organic molecules) 26a functioning as memory elements. Accordingly, the charge retention properties of the organic molecular memory are further improved.

As the first organic molecules have electron-withdrawing substituents, the energy level is changed for the second organic molecules having the memory functions, so that movement of charges from the second organic molecules to the first organic molecules can be restrained. Accordingly, the charge retention properties of the organic molecular memory are also improved in this aspect.

EXAMPLES

In the following, examples are described.

Example

As shown in FIG. 13, a self-assembled film of molecules in which anthracene derivatives as the fused polycyclic groups for causing the porphyrin to contribute to electronic polarization (molecular polarization) are bound to porphyrin derivatives serving to store charges, is formed on a silicon substrate. Cyano groups are bound to the anthracene, to adjust the energy level and prevent charge transfers between the anthracene and the porphyrin derivatives serving to store charges.

A 5-nm thick silicon oxide film is formed on the self-assembled film. A gold electrode is deposited on the silicon oxide film, to form memory elements.

The bias voltage dependence of the capacitance between the silicon substrate and the gold electrode is measured. With the silicon substrate being the reference, the capacitance-bias voltage dependence in the 0 to −5 V region is measured before and after a voltage of −15 V is applied to the gold electrode. As charges are stored in the molecules, the capacitance-bias voltage dependence shifts 0.9 V, which is equivalent to the potential generated by the charges.

The dependence of the shift on the time that has elapsed since writing is measured. In this manner, the charge retention time of the molecules can be estimated. In this case, the charges decrease by half in approximately one hour.

Comparative Example

A self-assembled film of the porphyrin derivative shown in FIG. 3 is formed on a silicon substrate, and a 5-nm thick silicon oxide film is formed on the self-assembled film. Further, a gold electrode is deposited on the silicon oxide film, to form memory elements.

After that, the bias voltage dependence of the capacitance between the silicon substrate and the gold electrode is measured. With the silicon substrate being the reference, the capacitance-bias voltage dependence in the 0 to −5 V region is evaluated before and after a voltage of −15 V is applied to the gold electrode. As charges are stored in the molecules, the capacitance-bias voltage dependence shifts 1.1 V, which is equivalent to the potential generated by the charges.

The dependence of the shift on the time that has elapsed since writing is measured. In this manner, the charge retention time of the molecules can be estimated. In this case, the charges decrease by half in approximately ten seconds, though the precision is not necessarily high because the time is short.

As can be seen from a comparison between Example and Comparative Example, the charge retention time is improved by introducing fused polycyclic groups into the organic molecules in the organic molecular layer.

In the above described embodiments and Example, the organic molecules forming organic molecular layers include charge-storage molecular chains or variable-resistance molecular chains, and organic molecules with fused polycyclic groups. However, it should be noted that organic molecular layers may contain other organic molecules as well as charge-storage molecular chains or variable-resistance molecular chains, and organic molecules with fused polycyclic group.

Also, each organic molecular memory is not necessarily of a stacked-gate type or a cross-point type, but may have any other structure such as a three-dimensional structure.

While certain embodiments have been described, these embodiments have been presented by way of example only, and are not intended to limit the scope of the inventions. Indeed, organic molecular memories described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. An organic molecular memory comprising:
    a semiconductor layer;
    an organic molecular layer formed above the semiconductor layer, the organic molecular layer including an organic molecule having a charge-storage molecular chain, a fused polycyclic group different from the charge-storage molecular chain and a linker;
    an insulating layer formed above the organic layer; and
    a gate electrode formed above the insulating layer,
    wherein the organic molecule is bound to either the semiconductor layer or the insulating layer at one point by the linker,
    wherein the charge-storage molecular chain comprises a structure selected from the group consisting of metalloporphyrin, metalloporphyrin derivatives, metallophthalocyanine and metallophthalocyanine derivatives.

2. The memory according to claim 1, wherein relative permittivity of the organic molecular layer is 5.5 or higher.

3. The memory according to claim 1, wherein an electron-withdrawing substituent bonds to the fused polycyclic group.

4. The memory according to claim 1, wherein the fused polycyclic group is anthracene.

5. The memory according to claim 3, wherein the electron-withdrawing substituent is a fluorine atom, a chlorine atom, or a cyano group.

6. An organic molecular memory comprising:
    a semiconductor layer;
    an organic molecular layer formed above the semiconductor layer, the organic molecular layer including a first molecule and a second molecule, the first organic molecule having a charge-storage molecular chain and a first linker, the second organic molecule having a fused polycyclic group different from the charge-storage molecular chain and a second linker;
    an insulating layer formed above the organic layer; and
    a gate electrode formed above the insulating layer,
    wherein the first organic molecule is bound to either the semiconductor layer or the insulating layer at one point by the first linker and the second organic molecule is bound to either the semiconductor layer or the insulating layer at one point by the second linker,
    wherein the charge-storage molecular chain comprises a structure selected from the group consisting of metalloporphyrin, metalloporphyrin derivatives, metallophthalocyanine and metallophthalocyanine derivatives.

7. The memory according to claim 6, wherein relative permittivity of the organic molecular layer is 5.5 or higher.

8. The memory according to claim 6, wherein an electron-withdrawing substituent bonds to the fused polycyclic group.

9. The memory according to claim 8, wherein the electron-withdrawing substituent is a fluorine atom, a chlorine atom, or a cyano group.

10. The memory according to claim 6, wherein the fused polycyclic group is anthracene.

* * * * *